United States Patent
Kim et al.

(10) Patent No.: US 10,538,846 B2
(45) Date of Patent: Jan. 21, 2020

(54) ETCHING SOLUTION COMPOSITION FOR TUNGSTEN LAYER, METHOD FOR PREPARING ELECTRONIC DEVICE USING THE SAME AND ELECTRONIC DEVICE

(71) Applicant: Dongwoo Fine-Chem Co., Ltd., Iksan-si (KR)

(72) Inventors: Seong-Min Kim, Iksan-si (KR); Yong-Jun Cho, Daejeon (KR); Kyong-Ho Lee, Osan-si (KR)

(73) Assignee: Dongwoo Fine-Chem Co., Ltd., Iksansi, Jeollabuk-Do (KR)

(*) Notice: Subject to any disclaimer, the term of this patent is extended or adjusted under 35 U.S.C. 154(b) by 0 days.

(21) Appl. No.: 15/259,669

(22) Filed: Sep. 8, 2016

(65) Prior Publication Data
US 2017/0167032 A1    Jun. 15, 2017

(30) Foreign Application Priority Data

Dec. 11, 2015 (KR) .................. 10-2015-0177420
Mar. 21, 2016 (KR) .................. 10-2016-0033169

(51) Int. Cl.
*H01L 21/3213* (2006.01)
*C23F 1/10* (2006.01)

(52) U.S. Cl.
CPC .......... *C23F 1/10* (2013.01); *H01L 21/32134* (2013.01)

(58) Field of Classification Search
CPC ...... C23F 1/10; C23F 1/38; C23F 1/14; H01L 21/32134
See application file for complete search history.

(56) References Cited

U.S. PATENT DOCUMENTS

| 2009/0256263 A1* | 10/2009 | Bonilla | H01L 21/76804 257/762 |
| 2015/0104952 A1* | 4/2015 | Cui | H01L 21/02063 438/745 |
| 2016/0185595 A1* | 6/2016 | Chen | H01L 21/02063 216/13 |
| 2016/0230130 A1* | 8/2016 | Schumann | C11D 3/2041 |
| 2016/0281038 A1* | 9/2016 | Tamai | C23G 1/061 |
| 2017/0200601 A1* | 7/2017 | Song | H01L 21/02063 |

FOREIGN PATENT DOCUMENTS

| CN | 101356629 A | 1/2009 | |
| JP | 2004031443 A | 1/2004 | |
| JP | 2010524208 A | 7/2010 | |
| JP | 2011233769 A | 11/2011 | |
| JP | WO 2015111684 A1 * | 7/2015 | ............. C23G 1/061 |
| KR | 20110031233 A | 3/2011 | |
| WO | WO-2015017659 A1 | 2/2015 | |

OTHER PUBLICATIONS

"Chinese Application Serial No. 201610864614.3 Office Action dated Aug. 3, 2018", (Aug. 3, 2018), 17 pgs.

* cited by examiner

*Primary Examiner* — Duy Vu N Deo
*Assistant Examiner* — Mahmoud Dahimene
(74) *Attorney, Agent, or Firm* — Schwegman Lundberg & Woessner, P.A.

(57) ABSTRACT

The present disclosure relates to an etching solution composition for a tungsten layer including N-methylmorpholine N-oxide and water, which is effective in selectively etching only a tungsten-based metal without etching a titanium nitride-based metal or a titanium aluminum carbide layer.

8 Claims, No Drawings

ETCHING SOLUTION COMPOSITION FOR TUNGSTEN LAYER, METHOD FOR PREPARING ELECTRONIC DEVICE USING THE SAME AND ELECTRONIC DEVICE

CLAIM FOR PRIORITY

This application claims the benefit of Korean Patent Application No. KR 10-2015-0177420, filed Dec. 11, 2015 and Korean Patent Application No, KR 10-2016-0033169 filed Mar. 21, 2016, which are hereby incorporated by reference in its entirety into this application.

FIELD OF THE INVENTION

The present disclosure relates to an etching solution composition for a tungsten layer, and in particular, to an etching solution composition for a tungsten layer including N-methylmorpholine N-oxide and water, which is effective in selectively etching only a tungsten-based metal without etching a titanium nitride-based metal or a titanium aluminum carbide metal.

BACKGROUND OF THE INVENTION

Tungsten or tungsten-based metals are used in gate electrode, wire, barrier layer or contact hole and via hole embodiment and the like of thin film transistors of liquid crystal displays and semiconductor devices. In addition, tungsten or tungsten-based metals are used as a tungsten heater in the field of micro electro mechanical systems (MEMS).

With the tungsten or the tungsten-based metals, titanium nitride (TiN), a titanium-based metal, is used as an underlayer or a cap layer of a precious metal, aluminum (Al) or copper (Cu) wire in semiconductor devices, liquid crystal displays, micro electro mechanical systems (MEMS) devices, print wiring boards and the like. In addition, titanium nitride is sometimes used as a barrier metal or a gate metal in semiconductor devices.

When forming both the tungsten and the titanium nitride to layers using CVD or sputtering, there is a problem in that, in semiconductor devices, the layers are attached to parts other than an actual device forming part, or the other side of a substrate (wafer), the edges of a substrate (wafer), an exterior wall of a layer forming device, inside an exhaust pipe or the like, and these are detached causing the generation of alien substances in the device forming part.

Particularly, a process of removing unnecessary parts leaving only tungsten or a tungsten alloy required for a device forming process of a semiconductor device such as a wire on a substrate or a via hole is required, and sometimes, a process removing all of tungsten or a tungsten alloy, or a barrier layer such as titanium nitride is used, however, depending on the properties of device preparation or depending on the properties of an etching solution, a process removing only tungsten or a tungsten alloy and suppressing the etching of a barrier layer such as titanium nitride, or, on the contrary, increasing the etching of titanium nitride while suppressing the etching of tungsten or a tungsten alloy is sometimes used. This is mostly due to the fact that semiconductor manufacturing processes are conducted considering properties of a device.

In such cases, properties of a device need to be obtained by selectively removing unnecessary parts in a device manufacturing process, and for such selective removal, a target layer needs to be selectively removed using an etching composition selective for tungsten or a tungsten layer, and a titanium nitride layer used as a material of a barrier layer.

In this case, tungsten or a tungsten alloy is preferably processed using wet etching having superior productivity rather than dry etching in processes for manufacturing semiconductor devices, liquid crystal displays, MEMS devices, print wiring boards and the like.

Korean Patent Application Laid-Open Publication No. 10-2011-0031233 discloses an existing etching solution for the wet etching. The etching solution is an etching solution using hydrogen peroxide, an organic acid salt and water, and etches titanium-based, tungsten-based, titanium-tungsten-based metals or nitrides thereof without etching Al, SiNx and the like, however, the etching composition selective for the metals has problems of causing hydrogen peroxide decomposition due to instability of the hydrogen peroxide, etching titanium and titanium nitride as well in addition to tungsten, and causing changes in the etch amount depending on the deposition time.

In addition, Japanese Patent Application Laid-Open Publication No. 2004-031443 discloses a composition polishing copper-based metals and titanium-based metals (including nitrides thereof) using a polishing solution containing an oxidizing agent, a dissolving agent for an oxidized metal, a metal corrosion preventing agent and water, and the polishing solution may have a problem of, in addition to the inconvenience coming from removing metals using a polishing method, a process increase in terms of going through a process of washing a substrate surface using a separate washing liquid in order to remove contaminated polished particles remaining on the substrate surface after being removed using the polishing method, and a cost increase, and in addition to these, has a problem of etching titanium and titanium nitride as well in addition to tungsten, and causing changes in the etch amount depending on the deposition time.

In view of the above, in the processes for manufacturing semiconductor devices, liquid crystal display devices and MEMS devices, development of etching solution compositions having smaller changes in the etch amount depending on the time of deposition in the etching solution composition while etching tungsten or a tungsten alloy without etching titanium nitride has been required.

PRIOR ART DOCUMENTS

Patent Documents

Korean Patent Application Laid-Open Publication No. 10-2011-0031233
Japanese Patent Application Laid-Open Publication No. 2004-031443

SUMMARY OF THE INVENTION

In view of the above, the present disclosure is directed to providing an etching solution composition for a tungsten layer exhibiting excellent etching selectivity for a tungsten-based metal when etching a semiconductor device, and having etching restraint for a titanium nitride-based metal or a titanium aluminum carbide metal.

The present disclosure is also directed to providing an etching solution composition for a tungsten layer capable of uniformly etching a tungsten-based metal.

The present disclosure is also directed to providing an electronic device including a tungsten layer etched using the etching solution composition for a tungsten layer.

An aspect of the present disclosure provides an etching solution composition for a tungsten layer including N-methylmorpholine N-oxide and water.

Another aspect of the present disclosure provides a method for preparing an electronic device including etching a tungsten-based metal using the etching solution composition for a tungsten layer of the present disclosure.

Still another aspect of the present disclosure provides an electronic device prepared using the preparation method of the present disclosure.

DETAILED DESCRIPTION OF THE EMBODIMENTS

Hereinafter, the present disclosure will be described in more detail.

In a semiconductor manufacturing process, when a tungsten (W)-based metal, a titanium nitride (TiN)-based metal or a titanium aluminum carbide (TiAlC) metal are present together as a barrier layer, a process etching only the unnecessary tungsten-based metal and suppressing the etching of the titanium nitride-based metal or the titanium aluminum carbide metal is required.

This is due to the fact that unnecessary parts need to be selectively removed in a semiconductor device manufacturing process to obtain properties of the device, and for this, an etching solution composition selectively etching only the tungsten-based metal without etching the titanium nitride-based metal or the titanium aluminum carbide metal is required.

Accordingly, the present disclosure is to provide an etching solution composition for tungsten having properties such as above.

The present disclosure relates to an etching solution composition for a tungsten layer including N-methylmorpholine N-oxide and water.

(A) N-Methylmorpholine N-Oxide (NMMO)

The etching solution composition for a tungsten layer of the present disclosure includes N-methylmorpholine N-oxide (NMMO).

The N-methylmorpholine N-oxide oxidizes and etches a tungsten-based metal, and performs a role of preventing corrosion of a titanium nitride-based metal or a titanium aluminum carbide metal.

Accordingly, the etching solution composition for a tungsten layer of the present disclosure is capable of etching only the tungsten-based metal without etching the titanium nitride-based metal or the titanium aluminum carbide metal.

The N-methylmorpholine N-oxide is included in 25% by weight to 50% by weight and preferably in 35% by weight to 48.5% by weight with respect to the total weight of the etching solution composition for a tungsten layer of the present disclosure.

In addition, when the N-methylmorpholine N-oxide is included in less than 25% by weight, an etching ability for the tungsten-based metal declines, and when the N-methylmorpholine N-oxide is included in greater than 50% by weight, etch uniformity for the tungsten-based metal deceases.

(B) Water

The etching solution composition for a tungsten layer of the present disclosure includes water.

The water is deionized water, and is used as a solvent of the N-methylmorpholine N-oxide (A) described above. In addition, the water performs a role of solubilizing and removing oxidized tungsten salts.

The water is included in a residual quantity with respect to the total weight of the etching solution composition for a tungsten layer of the present disclosure.

(C) Compound of Chemical Formula 1

The etching solution composition for a tungsten layer of the present disclosure further includes a compound of the following Chemical Formula 1, an amine oxide compound.

[Chemical Formula 1]

R1 is a linear alkyl group having 4 to 18 carbon atoms.

The compound of Chemical Formula 1 oxidizes and etches a tungsten-based metal, and performs a role of preventing corrosion of a titanium nitride-based metal.

Accordingly, using the compound of Chemical Formula 1 with the N-methylmorpholine N-oxide (A) described above is capable of further enhancing a property of the etching solution composition etching only a tungsten-based metal without etching a titanium nitride-based metal.

R1 of the compound of Chemical Formula 1 is more preferably an alkyl group having 6 to 12 carbon atoms.

In addition, the compound of Chemical Formula 1 preferably includes one or more types selected from the group consisting of hexadecyldimethylamine N-oxide (HDAO) and lauryldimethylamine N-oxide (LDAO).

When the etching solution composition for a tungsten layer of the present disclosure further includes the compound of Chemical Formula 1, the N-methylmorpholine N-oxide is included in 30% by weight to 50% by weight and the compound of Chemical Formula 1 is included in in 0.3% by weight to 15% by weight with respect to the total weight of the etching solution composition for a tungsten layer, and water is included in a residual quantity so that the total weight of the etching solution composition for a tungsten layer becomes 100% by weight.

In addition, the compound of Chemical Formula 1 is preferably included in 0.3% by weight to 3% by weight.

When the compound of Chemical Formula 1 is included in less than 0.3% by weight, an etching ability and etch uniformity for a tungsten-based metal decline, and when included in greater than 15% by weight, etch uniformity for a tungsten-based metal increases, however, an effect of increasing an etching amount is insignificant.

(D) Compound of Chemical Formula 2

The etching solution composition for a tungsten layer of the present disclosure further includes a compound of the following Chemical Formula 2, an amine compound.

$$NH_2C_2H_4(NHC_2H_4)_nNH_2$$ [Chemical Formula 2]

n is an integer of 0 to 2.

The compound of Chemical Formula 2 oxidizes and etches a tungsten-based metal, and performs a role of preventing damages to a titanium aluminum carbide metal by adjusting a pH of the etching solution composition for a tungsten layer to 10 to 12.

Accordingly, using the compound of Chemical Formula 2 with the N-methylmorpholine N-oxide (A) described above is capable of further enhancing a property of the etching solution composition etching only a tungsten-based metal without etching a titanium aluminum carbide metal.

In addition, the compound of Chemical Formula 2 preferably includes one or more types selected from the group consisting of ethylenediamine (EDA), diethylenetriamine (DETA) and triethylenetetramine (TETA).

When the etching solution composition for a tungsten layer of the present disclosure further includes the compound of Chemical Formula 2, the N-methylmorpholine N-oxide is included in 30% by weight to 50% by weight and the compound of Chemical Formula 2 is included in in 0.1% by weight to 1.2% by weight with respect to the total weight of the etching solution composition for a tungsten layer, and water is included in a residual quantity so that the total weight of the etching solution composition for a tungsten layer becomes 100% by weight.

In addition, the compound of Chemical Formula 2 is preferably included in 0.1% by weight to 1% by weight.

When the compound of Chemical Formula 2 is included in less than 0.1% by weight, a pH does not increase much, and a decrease in the etch rate for the titanium aluminum carbide metal is insignificant, and when included in greater than 1.2% by weight, an etch rate for the tungsten-based metal decreases.

In addition an etching temperature of the etching solution composition for a tungsten layer further including the compound of Chemical Formula 2 is from 30° C. to 80° C. and preferably from 30° C. to 50° C.

When the etching temperature is lower than 30° C., an etch rate for the tungsten layer is excessively slow unable to etch the tungsten layer, and when the temperature is higher than 80° C., damages to the titanium aluminum carbide metal may not be prevented.

The etching solution composition for a tungsten layer of the present disclosure may carry out etching using etching methods commonly known in the art. For example, methods using deposition, spraying, or deposition and spraying may be used, and in this case, as the conditions for etching, the temperature is generally from 30° C. to 80° C. and preferably from 50° C. to 70° C., and the time taken for deposition, spraying, or deposition and spraying is generally for 30 seconds to 10 minutes and preferably for 1 minute to 5 minutes. However, such conditions are not strictly applied, and those skilled in the art may select conditions that are proper or readily obtained.

In addition, the present disclosure provides a method for preparing an electronic device including a process of etching a tungsten-based metal using the etching solution composition for a tungsten layer of the present disclosure, and an electronic device prepared using the preparation method.

By selectively etching only a tungsten-based metal without etching a titanium nitride-based metal through using the etching solution composition for a tungsten layer of the present disclosure, properties of an electronic device may be further enhanced.

Hereinafter, the present disclosure will be described in more detail with reference to examples, comparative examples and test examples. However, the following examples, comparative examples and test examples are for illustrative purposes only, and the scope of the present disclosure is not limited to the following examples, comparative examples and test examples, and may be diversely amended and modified.

EXAMPLES 1 TO 5

Preparation of Etching Solution Composition for Tungsten Layer

Etching solution compositions for a tungsten layer of Examples 1 to 5 were prepared by mixing the components listed in the following Table 1 in the content listed therein.

TABLE 1

| | NMMO | HDAO | LDAO | (Unit: % by weight) Deionized Water |
|---|---|---|---|---|
| Example 1 | 50 | — | — | Residual Quantity |
| Example 2 | 47.5 | 1.5 | — | Residual Quantity |
| Example 3 | 47.5 | — | 1.5 | Residual Quantity |
| Example 4 | 30 | 12 | — | Residual Quantity |
| Example 5 | 30 | — | 12 | Residual Quantity |

NMMO: N-methylmorpholine N-oxide
HDAO: hexadecyldimethylamine N-oxide
LDAO: Lauryldimethylamine N-oxide

COMPARATIVE EXAMPLES 1 TO 4

Preparation of Etching Solution Composition for Tungsten Layer

Etching solution compositions for a tungsten layer of Comparative Examples 1 to 4 were prepared by mixing the components listed in the following Table 2 in the content listed therein.

TABLE 2

| | Phosphoric Acid | Nitric Acid | AP | APS | Hydrogen Peroxide | AS | (Unit: % by weight) Deionized Water |
|---|---|---|---|---|---|---|---|
| Comparative Example 1 | 65 | 15 | 0.1 | — | — | — | Residual Quantity |
| Comparative Example 2 | 65 | 15 | — | 0.1 | — | — | Residual Quantity |
| Comparative Example 3 | — | — | — | — | 59 | 1 | Residual Quantity |
| Comparative Example 4 | — | — | 1 | — | 59 | — | Residual Quantity |

AP: Ammonium phosphate
APS: Ammonium persulfate
AS: Ammonium sulfate

TEST EXAMPLE 1

Measurement on Etch Rate and Etch Uniformity for Tungsten Layer

After cutting a tungsten layer having a thickness of 1500 Å to a size of 2×2 cm$^2$, the tungsten layer was etched by being immersed in each of the etching solution compositions for a tungsten layer of Examples 1 to 5 and Comparative Examples 1 to 4 for 1 minute at a temperature of 70° C., and the tungsten layer was washed with DIW and then dried.

After that, the thickness of the tungsten layer was measured using a SEM to measure an etch rate for the tungsten layer.

In addition, in order to evaluate uniformity of the etched tungsten layer, the thickness of the tungsten layer was measured at random places, and thickness variation (etch rate) was evaluated using the following criteria.

The etch rate and the etch uniformity are shown in the following Table 3.

<Evaluation Criteria on Uniformity of Tungsten Layer>
⊚: Thickness uniformity was excellent with thickness variation (etch rate) of less than 1 Å/min.
○: Thickness uniformity was favorable with thickness variation (etch rate) of greater than or equal to 1 Å/min and less than 5 Å/min.

Δ: Thickness uniformity was poor with thickness variation (etch rate) of greater than or equal to 5 Å/min and less than 10 Å/min.

X: Thickness uniformity was very poor with thickness variation (etch rate) of 10 Å/min or greater.

TEST EXAMPLE 2

Measurement on Etch Rate for Titanium Nitride Layer

After cutting a titanium nitride layer having a thickness of 220 Å to a size of 2×2 cm², the titanium nitride layer was etched by being immersed in each of the etching solution compositions for a tungsten layer of Examples 1 to 5 and Comparative Examples 1 to 4 for 1 minute at a temperature of 70° C., and the titanium nitride layer was washed with DIW and then dried.

After that, the thickness of the titanium nitride layer was measured using an ellipsometer to measure an etch rate for the titanium nitride layer, and the results are shown in the following Table 3.

TABLE 3

| | Etch Rate for Tungsten (W) (Å/min) | Tungsten Layer Uniformity | Etch Rate for Titanium Nitride (Å/min) |
|---|---|---|---|
| Example 1 | 119 | ○ | 0 |
| Example 2 | 125 | ⊚ | 0 |
| Example 3 | 154 | ⊚ | 0 |
| Example 4 | 110 | ⊚ | 0 |
| Example 5 | 121 | ⊚ | 0 |
| Comparative Example 1 | 8.87 | Δ | 7.67 |
| Comparative Example 2 | 7.48 | Δ | 6.85 |
| Comparative Example 3 | 32.8 | ○ | 2.3 |
| Comparative Example 4 | 30.2 | ○ | 3.7 |

From the results shown in Table 3, the etching solution compositions for a tungsten layer of Examples 1 to 5, etching solution compositions for a tungsten layer of the present disclosure, etched the tungsten layer, but did not etch the titanium nitride layer.

In other words, it was seen that the etching solution compositions for a tungsten layer of the present disclosure selectively etched only the tungsten layer without etching the titanium nitride layer.

In addition, it was seen that etch uniformity was obtained when etching the tungsten layer, and the etching solution compositions for a tungsten layer of Examples 2 to 5 including the compound of Chemical Formula 1 more uniformly etched the tungsten layer.

Meanwhile, it was identified that the etching solution compositions for a tungsten layer of Comparative Examples 1 to 4, existing etching solution compositions for a tungsten layer, exhibited a low etch rate for the tungsten layer and also etched the titanium nitride layer.

In addition, compared to the etching solution compositions for a tungsten layer of Examples 1 to 5, etch uniformity for the tungsten layer was not favorable.

Accordingly, the etching solution composition for a tungsten layer of the present disclosure is effective in etching only a tungsten layer without etching a titanium nitride layer, and etching the tungsten layer very uniformly.

EXAMPLES 6 TO 13 AND COMPARATIVE EXAMPLE 5

Etching Solution Composition for Tungsten Layer

Etching solution compositions for a tungsten layer of Examples 6 to 13 and Comparative Example 5 were prepared by mixing the components listed in the following Table 4 in the content listed therein.

TABLE 4

| | NMMO | DETA | TETA | BA | (Unit: % by weight) Deionized Water |
|---|---|---|---|---|---|
| Example 6 | 50 | 0.5 | — | — | Residual Quantity |
| Example 7 | 35 | 0.5 | — | — | Residual Quantity |
| Example 8 | 25 | 0.5 | — | — | Residual Quantity |
| Example 9 | 25 | 0.1 | — | — | Residual Quantity |
| Example 10 | 25 | 1 | — | — | Residual Quantity |
| Example 11 | 25 | — | 0.5 | — | Residual Quantity |
| Example 12 | 25 | — | 0.1 | — | Residual Quantity |
| Example 13 | 25 | — | 1 | — | Residual Quantity |
| Comparative Example 5 | — | 0.5 | — | — | Residual Quantity |

NMMO: N-methylmorpholine N-oxide
DETA: diethylenetriamine
TETA: triethylenetetramine
BA: n-butylamine

TEST EXAMPLE 3

Evaluation on Etching with Etching Solution Composition for Tungsten Layer

A wafer depositing a tungsten layer (W), a titanium nitride layer (TiN) and a titanium aluminum carbide layer (TiAlC) on a silicon wafer was prepared, and the substrate was cut to a size of 2×2 cm².

The substrate was etched by being immersed in each of the etching solution compositions for a tungsten layer of Examples 6 to 13 and Comparative Example 5 for 5 minute at a temperature of 40° C., and the substrate was washed with DIW and then dried.

After that, etch rates for the tungsten layer, the titanium nitride layer and the titanium aluminum carbide layer were measured by observing the degree of damages to the layer of the substrate using an ellipsometer.

Evaluation criteria on the damages to the titanium nitride layer and the titanium aluminum carbide layer are as follows, and the results are shown in the following Table 5.

<Evaluation Criteria>
⊚: TiN and TiAlC etch rate<1 Å/min
○: 1 Å/min≤TiN and TiAlC etch rate<5 Å/min
Δ: 5 Å/min≤TiN and TiAlC etch rate<10 Å/min
X: TiN and TiAlC etch rate≥10 Å/min

TABLE 5

| | Target to Remove Etch Rate for W (Å/min) | Attack Free Layer | | |
|---|---|---|---|---|
| Category | | TiN | TiAlC | pH |
| Example 6 | 16.2 | ⊚ | ⊚ | 11.2 |
| Example 7 | 16.6 | ⊚ | ⊚ | 11.1 |
| Example 8 | 10.2 | ⊚ | ⊚ | 11.2 |
| Example 9 | 19.8 | ⊚ | ⊚ | 10.4 |
| Example 10 | 14.8 | ⊚ | ⊚ | 11.6 |
| Example 11 | 15.8 | ⊚ | ⊚ | 11.3 |

TABLE 5-continued

| Category | Target to Remove Etch Rate for W (Å/min) | Attack Free Layer | | pH |
|---|---|---|---|---|
| | | TiN | TiAlC | |
| Example 12 | 18.6 | ⊚ | ⊚ | 10.2 |
| Example 13 | 13.1 | ⊚ | ⊚ | 11.3 |
| Comparative Example 5 | 4.0 | ⊚ | ⊚ | 11.0 |

From the results shown in Table 5, Examples 6 to 13, the etching solution compositions for a tungsten layer of the present disclosure, etched the tungsten layer, but did not etch the titanium nitride layer and the titanium aluminum carbide layer.

In other words, it was seen that the etching solution compositions for a tungsten layer of the present disclosure selectively etched the tungsten layer without etching the titanium nitride layer and the titanium aluminum carbide layer.

Meanwhile, it was seen that the etching solution composition for a tungsten layer of Comparative Example 5 that did not include NMMO did not etch the titanium nitride layer and the titanium aluminum carbide layer, but was not able to etch the tungsten layer having the etch rate for the tungsten layer being too low.

Accordingly, the etching solution composition for a tungsten layer of the present disclosure is effective in etching a tungsten layer without etching a titanium nitride layer and a titanium aluminum carbide layer.

The etching solution composition for a tungsten layer of the present disclosure has an excellent etching ability for a tungsten-based metal, and is capable of uniformly etching a tungsten layer.

In addition, the etching solution composition for a tungsten layer of the present disclosure etches only a tungsten-based metal, and suppresses the etching of a titanium nitride-based metal or a titanium aluminum carbide metal, and therefore, is capable of selectively etching a tungsten-based metal when manufacturing a semiconductor device.

What is claimed is:

1. A method for preparing an electronic device comprising a process of etching a tungsten metal using an etching solution composition for a tungsten layer comprising N-methylmorpholine N-oxide; and water,
    wherein the electronic device comprises a tungsten metal, and comprises at least one selected from a titanium nitride metal or a titanium aluminum carbide metal,
    wherein the etching solution composition etches the titanium nitride metal or the titanium aluminum carbide metal at an etch rate of less than 1 Å/min,
    wherein the etching solution composition for a tungsten layer comprises:
    the N-methylmorpholine N-oxide in 25% by weight to 50% by weight, with respect to a total weight of the etching solution composition for a tungsten layer.

2. The method for preparing an electronic device of claim 1, the etching solution composition for a tungsten layer further comprises a compound of the following Chemical Formula 1:

[Chemical Formula 1]

wherein, R1 is a linear alkyl group having 4 to 18 carbon atoms.

3. The method for preparing an electronic device of claim 2, wherein the compound of Chemical Formula 1 includes one or more types selected from the group consisting of hexadecyldimethylamine N-oxide and lauryldimethylamine N-oxide.

4. The method for preparing an electronic device of claim 2, wherein the etching solution composition for a tungsten layer comprises:
    the N-methylmorpholine N-oxide in 30% by weight to 50% by weight;
    the compound of Chemical Formula 1 in 0.3% by weight to 15% by weight, with respect to the total weight of the etching solution composition for a tungsten layer; and
    the water in a residual quantity.

5. The method for preparing an electronic device of claim 1, wherein the etching solution composition for a tungsten layer further comprises a compound of the following Chemical Formula 2:

$$NH_2C_2H_4(NHC_2H_4)nNH_2 \quad \text{[Chemical Formula 2]}$$

wherein, n is an integer of 0 to 2.

6. The method for preparing an electronic device of claim 5, wherein the compound of Chemical Formula 2 includes one or more types selected from the group consisting of ethylenediamine, diethylenetriamine and triethylenetetramine.

7. The method for preparing an electronic device of claim 5, wherein the etching solution composition for a tungsten layer comprises:
    the N-methylmorpholine N-oxide in 30% by weight to 50% by weight;
    the compound of Chemical Formula 2 in 0.1% by weight to 1.2% by weight, with respect to the total weight of the etching solution composition for a tungsten layer; and
    the water in a residual quantity.

8. The method for preparing an electronic device of claim 5, wherein an etching temperature of the etching solution composition for a tungsten layer is from 30° C. to 80° C.

* * * * *